(12) United States Patent
Sudo (10) Patent No.: US 11,496,118 B2
(45) Date of Patent: *Nov. 8, 2022

(54) SEMICONDUCTOR DEVICE

(71) Applicant: Winbond Electronics Corp., Taichung (TW)

(72) Inventor: Naoaki Sudo, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 9 days.

This patent is subject to a terminal disclaimer.

(21) Appl. No.: 17/148,587

(22) Filed: Jan. 14, 2021

(65) Prior Publication Data

US 2021/0257997 A1 Aug. 19, 2021

(30) Foreign Application Priority Data

Feb. 18, 2020 (JP) .............................. JP2020-024854

(51) Int. Cl.
*H03K 3/012* (2006.01)
*G11C 5/14* (2006.01)
*G11C 16/30* (2006.01)
*H03K 19/00* (2006.01)
(Continued)

(52) U.S. Cl.
CPC ............... *H03K 3/012* (2013.01); *G11C 5/14* (2013.01); *G11C 5/148* (2013.01); *G11C 11/4072* (2013.01); *G11C 11/4074* (2013.01); *G11C 16/30* (2013.01); *H03K 19/0013* (2013.01); *H03K 19/0016* (2013.01)

(58) Field of Classification Search
CPC ............... H03K 3/012; H03K 19/0013; H03K 19/0016; G11C 11/4072; G11C 11/4074; G11C 16/30; G11C 5/14; G11C 5/148
USPC .................................................. 365/226, 227
See application file for complete search history.

(56) References Cited

U.S. PATENT DOCUMENTS 5,615,162 A 3/1997 Houston
5,696,729 A * 12/1997 Kitamura ................ G05F 3/262
326/62

(Continued)

FOREIGN PATENT DOCUMENTS

CN 103389963 8/2016
CN 109901694 6/2019
(Continued)

OTHER PUBLICATIONS

Office Action of Japan Counterpart Application, dated Nov. 10, 2021, pp. 1-5.
(Continued)

*Primary Examiner* — Son L Mai
(74) *Attorney, Agent, or Firm* — JCIPRNET (57) ABSTRACT

A semiconductor device that can automatically transition from a standby mode to a deep power down (DPD) mode is provided. The semiconductor device includes a DPD controller supporting the DPD mode and multiple internal circuits. The DPD controller measures a time since a time point of entering the standby mode and generates multiple power down enable signals for further reducing power consumption in the standby mode in response to elapse of a measurement time, so that operations of the multiple internal circuits are stopped in stages.

13 Claims, 7 Drawing Sheets

(51) Int. Cl.
*G11C 11/4072* (2006.01)
*G11C 11/4074* (2006.01)

(56) References Cited

U.S. PATENT DOCUMENTS

| | | | | |
|---|---|---|---|---|
| 6,058,063 | A * | 5/2000 | Jang | G11C 7/1078 |
| | | | | 365/189.11 |
| 6,510,096 | B2 * | 1/2003 | Choi | G11C 7/22 |
| | | | | 365/226 |
| 6,850,453 | B2 * | 2/2005 | Park | G11C 5/147 |
| | | | | 365/226 |
| 7,251,170 | B2 * | 7/2007 | Lee | G11C 11/40615 |
| | | | | 365/222 |
| 7,292,494 | B2 * | 11/2007 | Hsu | G11C 5/147 |
| | | | | 365/226 |
| 7,606,105 | B2 * | 10/2009 | Chu | G11C 5/144 |
| | | | | 365/229 |
| 9,037,890 | B2 * | 5/2015 | De Caro | G11C 5/147 |
| | | | | 713/320 |
| 9,922,684 | B2 * | 3/2018 | Pedersen | G11C 5/148 |
| 10,096,367 | B2 * | 10/2018 | Tanikawa | G11C 8/08 |
| 10,409,505 | B2 * | 9/2019 | Lewis | G06F 1/3287 |
| 10,539,989 | B1 * | 1/2020 | Pedersen | G06F 1/3206 |
| 10,770,119 | B2 * | 9/2020 | Lo | G11C 7/02 |
| 2006/0224909 | A1 | 10/2006 | Do | |
| 2008/0114923 | A1 | 5/2008 | In et al. | |
| 2011/0185208 | A1 | 7/2011 | Iwamoto et al. | |
| 2015/0269977 | A1 | 9/2015 | Ishizu et al. | |
| 2016/0217848 | A1 | 7/2016 | Ishizu et al. | |
| 2021/0096634 | A1 * | 4/2021 | Fastow | G11C 5/144 |
| 2021/0257032 | A1 * | 8/2021 | Sudo | G11C 16/30 |

FOREIGN PATENT DOCUMENTS

| | | |
|---|---|---|
| JP | H065088 | 1/1994 |
| JP | H11191289 | 7/1999 |
| JP | 2006228361 | 8/2006 |
| JP | 2006252748 | 9/2006 |
| JP | 2008108379 | 5/2008 |
| JP | 2013186920 | 9/2013 |
| JP | 2015195075 | 11/2015 |
| JP | 2016139450 | 8/2016 |
| TW | I299825 | 8/2008 |
| TW | I672704 | 9/2019 |

OTHER PUBLICATIONS

"Office Action of Taiwan Counterpart Application", dated Apr. 19, 2021, p. 1-p. 7.

"Office Action of Japan Counterpart Application", dated Apr. 7, 2021, p. 1-p. 5.

* cited by examiner

SEMICONDUCTOR DEVICE

CROSS-REFERENCE TO RELATED APPLICATION

This application claims the priority benefit of Japan application serial no. 2020-024854, filed on Feb. 18, 2020. The entirety of the above-mentioned patent application is hereby incorporated by reference herein and made a part of this specification.

BACKGROUND

Technical Field

The disclosure relates to a semiconductor device such as a flash memory, and in particular to operation in a standby mode or a deep power down mode.

Description of Related Art

The NAND type flash memory may be read or programmed in units of pages, and may be erased in units of blocks. The flash memory shown in the patent document (Japanese Laid-open No. 2006-252748) discloses the following technology: in the standby mode and the normal operating mode, different power supply voltages are supplied to the page buffer/sensing circuit, so as to reduce the power consumption in the standby mode.

In the flash memory, there are the active mode for reading, programming, erasing, etc. in response to a command from the user, and the standby mode for accepting the command from the user. In the standby mode, the operation of the internal circuit is restricted, so that the power consumption reaches below a certain level, but when a command is input from the user, the command must be immediately responded to. Therefore, even in the standby mode, off leak current is still generated in a volatile circuit such as a logic circuit or a register. The off leak current will increase as the element size shrinks. In addition, when the internal power supply voltage is used, the internal power supply voltage detection circuit must be operated, thereby consuming a certain degree of power. That is, it is difficult to reduce the current consumption in the standby mode.

In order to further reduce the power consumption in the standby mode, depending on the flash memory, a deep power down (hereinafter referred to as DPD) mode may be equipped. In the DPD mode, the internal power supply to a portion of the internal circuit used in the standby mode is cut off, so as to reduce the off leak current. In the DPD mode, for example, a DPD start command is used to enter the mode, and a DPD dismiss command is used to recover from the mode. The DPD mode requires a certain amount of time for the cut off circuit to operate normally, but has the merit of drastically reducing the power consumption.

Figure 1:
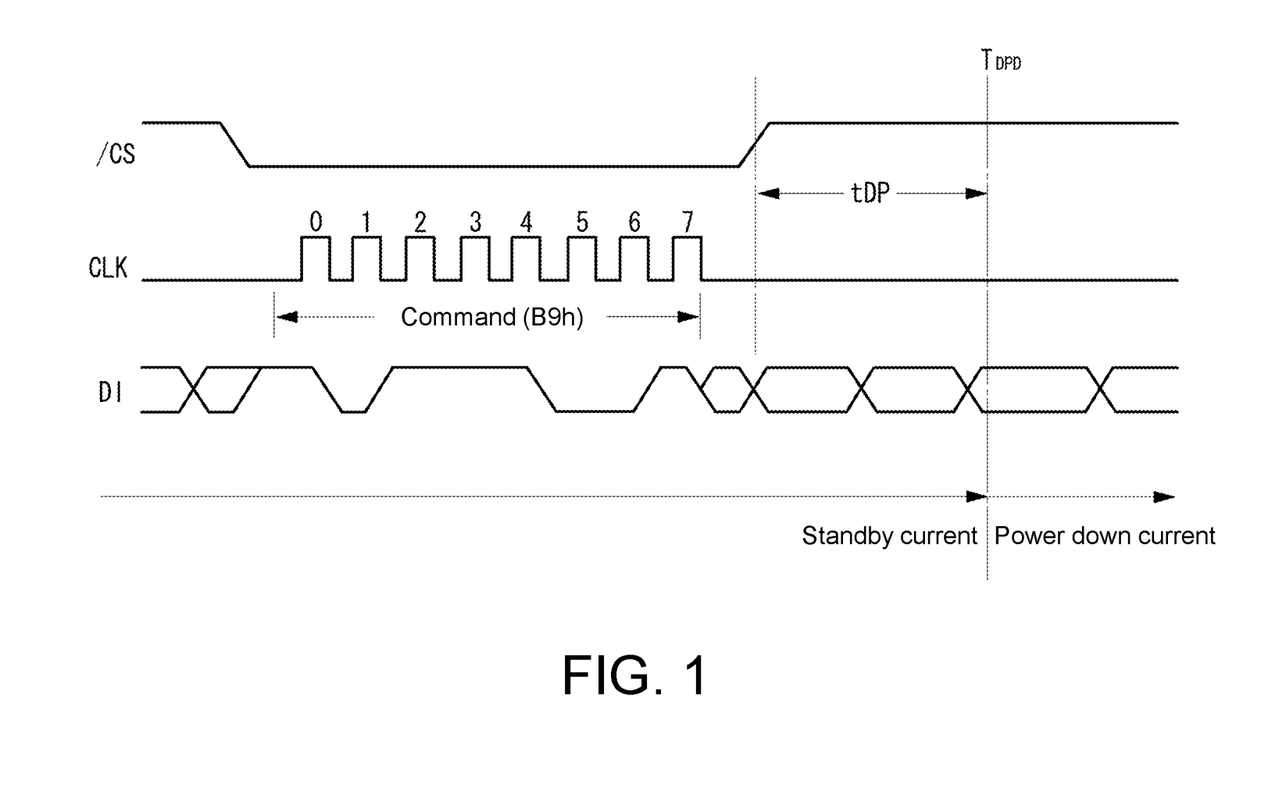
FIG. 1 is a diagram showing an example of operating waveforms when a conventional flash memory transitions to a deep power down (DPD) mode.

FIG. 1 shows an example of operating waveforms when a NAND type flash memory equipped with a serial peripheral interface (SPI) function transitions to the DPD mode. When in the standby mode, the flash memory is selected through setting a chip select signal /CS to a low level. During this period, a DPDDPD command (89h) is input from a data registration terminal DI in synchronization with a clock signal. The flash memory transitions to the DPD mode at a time $T_{DPD}$ after a certain period tDP has elapsed since the input of the DPD command to block the internal voltage supply to a specific internal circuit. During a period before the time $T_{DPD}$, the current in the standby mode is consumed. During a period after the time $T_{DPD}$, the current in the DPD mode is consumed.

Figure 2:
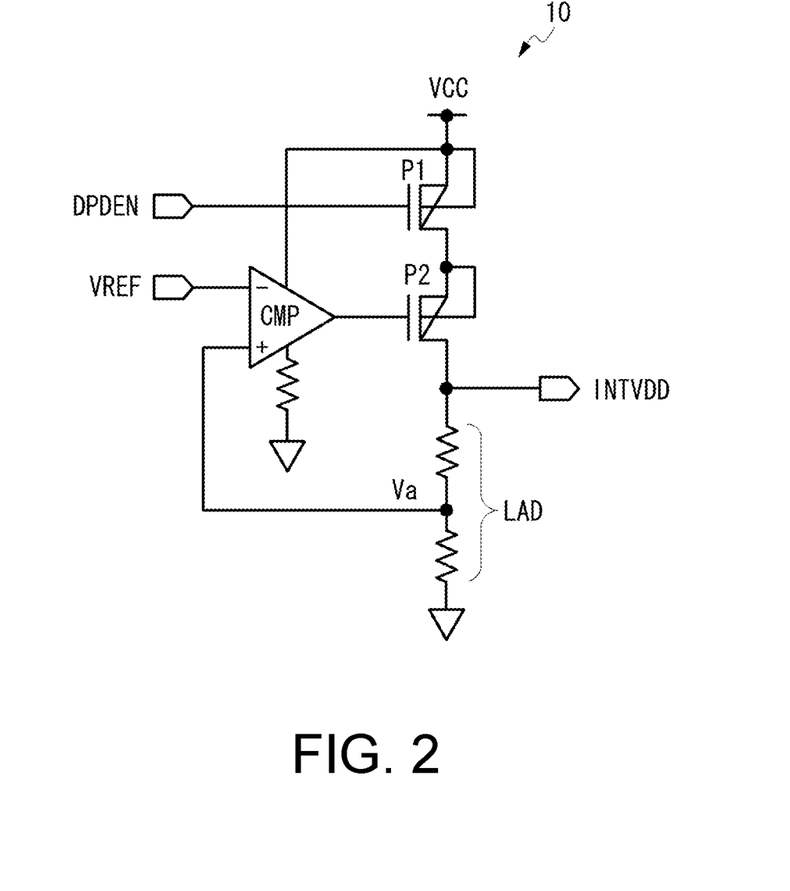
FIG. 2 is a diagram showing an example of an internal voltage generation circuit for standby supporting the DPD mode of the conventional flash memory.

FIG. 2 shows an example of an internal voltage generation circuit for standby supporting the DPD mode of a conventional flash memory. An internal voltage generation circuit 10 includes a p-channel metal oxide semiconductor (PMOS) transistor P1 and a PMOS transistor P2 connected in series between an external power supply voltage VCC (for example, 3.3 V) and a ground (GND) potential, a resistance ladder LAD, and a comparator CMP that compares a voltage Va divided by resistance of the resistance ladder LAD with a reference voltage VREF. A DPD enable signal DPDEN is applied to the gate of the transistor P1, a comparison result of the comparator CMP is applied to the gate of the transistor P2, and a voltage supply node INTVDD is connected between the transistor P2 and the resistance ladder LAD.

In the standby mode, the DPD enable signal DPDEN is at the L level, and the transistor P1 and the transistor P2 are turned on. In order to reduce the current consumed by the resistance ladder LAD, the resistance ladder LAD is set to high resistance. In addition, when the voltage supply node INTVDD outputs a target voltage, a tap position of the voltage Va is selected such that Va=VREF. In addition, the resistance of a general internal voltage generation circuit operating in a non-standby mode is less than the resistance ladder LAD of FIG. 2. At the voltage supply node INTVDD, for example, a 2.4 V voltage is generated.

When the user inputs the DPD command according to the sequence shown in FIG. 1, the controller of the flash memory enables the DPD enable signal DPDEN to be transferred from the L level to the H level within the period tDP since the input of the command, so that the transistor P1 is disconnected to block the external power supply voltage VCC. As a result, the power is not supplied to the circuit connected to the voltage supply node INTVDD, so the power consumption is further reduced compared with the standby mode.

In this way, the conventional flash memory has the following issue: in order to transition from the standby mode to the DPD mode, the user must input the DPD command, and if the flash memory does not support the DPD command, the transition to the DPD mode cannot be performed. Such issue is not limited to the flash memory, and is the same in other semiconductor devices.

SUMMARY

The semiconductor device of the disclosure includes: a semiconductor integrated circuit that can operate in response to an external input signal; a measurement part that measures a time since a time point of the semiconductor device entering the standby mode; and a generation part that generates multiple power down enable signals for further reducing the power consumption in the standby mode in response to an elapse of a measurement time measured by the measurement part.

According to the disclosure, it is possible to automatically transition from the standby mode to the power down mode without inputting a command, etc. for transitioning to the power down mode. Therefore, even a semiconductor device that does not support the command, etc. for transitioning to the power down mode can be transitioned to the power down mode. Furthermore, through generating multiple power down enable signals, it is possible to block the power supply to the internal circuit in stages according to the time elapsed since the standby mode. For example, it is possible to sequentially stop the operation from the internal circuit with low priority, so as to shorten the recovery time to the active mode.

DETAILED DESCRIPTION OF DISCLOSED EMBODIMENTS

The semiconductor device of the disclosure is not particularly limited, and may be implemented in, for example, a NAND type or NOR type flash memory, a dynamic random access memory (DRAM), a static random access memory (SRAM), a logic, an application specific integrated circuit (ASIC), a digital signal processor (DSP), etc.

Figure 3A:
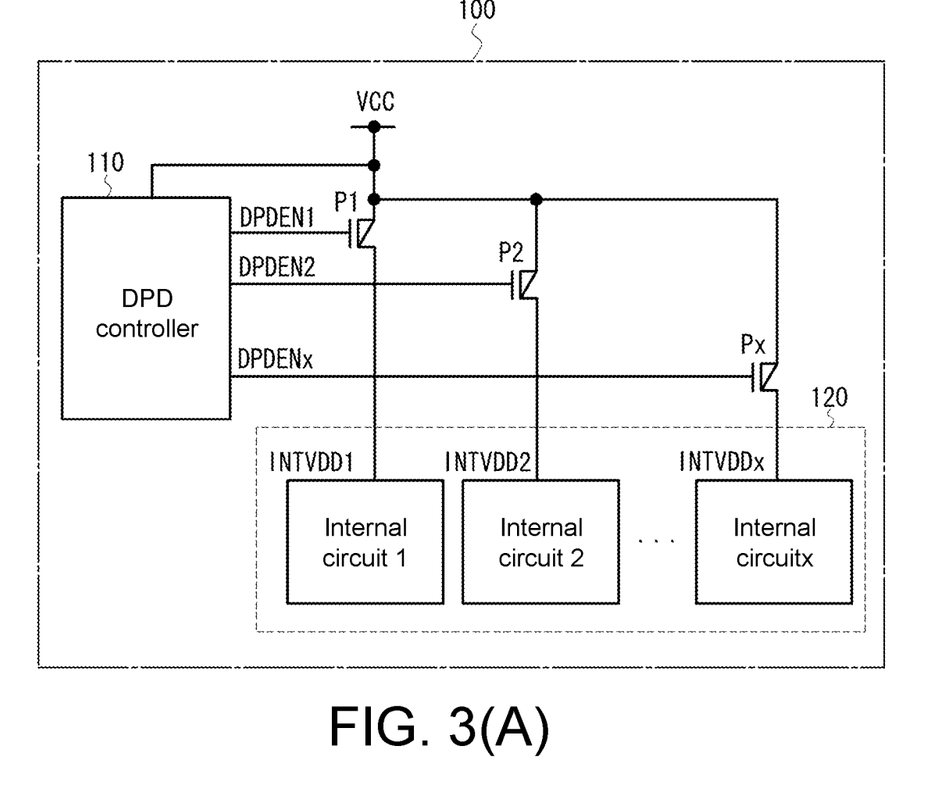
FIG. 3(A) is a diagram showing a schematic configuration of a semiconductor device according to an embodiment of the disclosure.
Figure 3B:
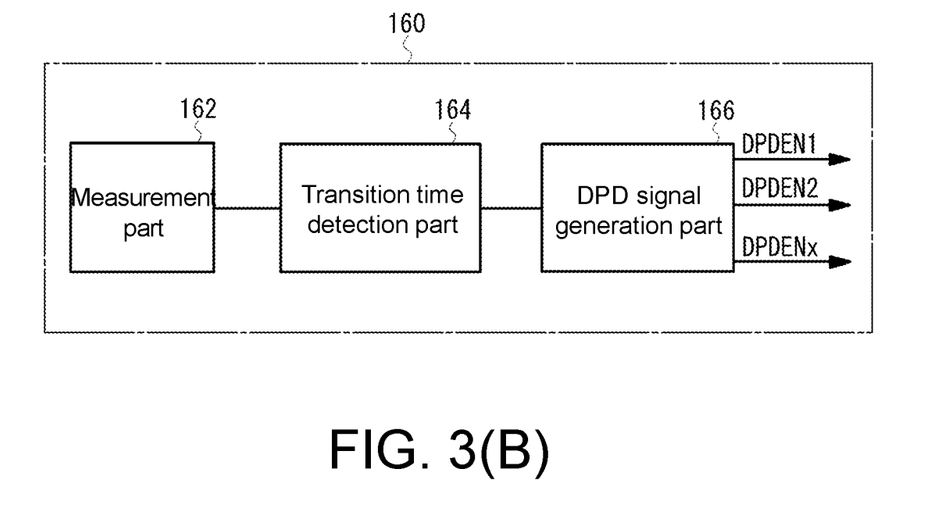
FIG. 3(B) is a diagram showing a functional configuration of a DPD determination part of an internal circuit supporting the DPD mode.

Next, the embodiments of the disclosure will be described in detail with reference to the drawings. FIG. 3 is a diagram showing a configuration of a semiconductor device 100 according to an embodiment of the disclosure. The semiconductor device 100 includes a deep power down (DPD) controller 110 corresponding to a DPD mode and an internal circuit 120 (composed of an internal circuit 1, an internal circuit 2, . . . , an internal circuit x). The circuits are integrated circuits integrated on a semiconductor substrate.

An external power supply voltage VCC (for example, 3.3 V) is supplied to the semiconductor device 100. The external power supply voltage VCC or an internal voltage VDD generated by the external power supply voltage VCC is supplied to the internal circuit 120. In an embodiment, the semiconductor device 100 may include multiple power consumption modes. In an active mode, the internal circuit 120 may operate at full specifications without power consumption restrictions. In a standby mode, the power consumption of the internal circuit 120 may be reduced according to determined requirements, and an input signal such as a command may be responded to. The standby mode is determined, for example, when the internal circuit 120 ends the determined operation or in response to an external command or control signal, and such standby mode is predefined in the semiconductor device 100. In the standby mode, for example, a boost circuit (charge pump circuit) is stopped, a clock oscillator is stopped, the internal voltage VDD is intermittently generated, or a complementary metal oxide semiconductor (CMOS) inverter is set to a tristate. In the DPD mode, the power supply to a specific internal circuit may be blocked to further reduce the power consumption in the standby mode.

In a conventional semiconductor device, in order to transition from the standby mode to the DPD mode, the input of an external command is required. In contrast, the semiconductor device 100 of this embodiment does not require the input of a command or a control signal for transitioning from the standby mode to the DPD mode, and can automatically enter the DPD mode. The dismiss of the DPD mode is implemented through, for example, the input of an arbitrary external command or control signal.

As shown in FIG. 3(A), the semiconductor device 100 includes the DPD controller 110. The DPD controller 110 controls the transition from the standby mode to the DPD mode when the semiconductor device 100 enters the standby mode. In the drawing, the DPD controller 110 generates multiple DPD enable signals DPDEN1, DPDEN2, and DPDENx, and the power supply to the internal circuit 1, the internal circuit 2, and the internal circuit x is blocked in stages through the enable signals. Therefore, in the DPD mode of this embodiment, the power consumption is reduced in stages.

The internal circuit 120 is an arbitrary circuit and is not particularly limited. However, since the power supply to the internal circuit 1, the internal circuit 2, and the internal circuit x is blocked in stages, it is ideal to distinguish between internal circuits with high priority that are intended to operate longer in the standby mode and internal circuits with low priority that may be stopped immediately to be supplied with the corresponding DPD enable signals.

An internal voltage VDD1, an internal voltage VDD2, and an internal voltage VDDx generated by the external power supply voltage VCC are supplied to a voltage supply node INTVDD1 of the internal circuit 1, a voltage supply node INTVDD2 of the internal circuit 2, and a voltage supply node INTVDDx of the internal circuit x. A p-channel metal oxide semiconductor (PMOS) transistor P1, a PMOS transistor P2, and a PMOS transistor Px are respectively connected between the external power supply voltage VCC and the voltage supply node INTVDD1, the voltage supply node INTVDD2, and the voltage supply node INTVDDx. The DPD enable signal DPDEN1, the DPD enable signal DPDEN2, and the DPD enable signal DPDENx are applied to each gate of the PMOS transistor P1, the PMOS transistor P2, and the PMOS transistor Px.

When the DPD controller 110 transitions from the standby mode to the DPD mode in order to further reduce the power consumption, the DPD enable signal DPDEN1, the DPD enable signal DPDEN2, and the DPD enable signal DPDENx are transferred from the L level to the H level in stages. In an embodiment, the DPD controller 110 enables the DPD enable signal DPDENx to be transferred from the L level to the H level, and sets the transistor Px to be not turned on when a time Ta has elapsed since a time Ts of entering the standby mode. As a result, the power supply to the internal circuit x is blocked, so a power consumption Wx of the internal circuit x is saved. Next, when a Tb time (Tb>Ta) has elapsed since the time Ts, the DPD enable signal DPDEN2 is transferred from the L level to the H level, and the transistor P2 is set to be not turned on. As a result, the power supply to the internal circuit 2 is blocked, so a power consumption W2 of the internal circuit 2 is saved.

Next, when a time Tc (Tc>Tb) has elapsed since the time Ts, the DPD enable signal DPDEN1 is transferred from the L level to the H level, and the transistor P1 is set to be not turned on. As a result, the power supply to the internal circuit 1 is blocked, so a power consumption W1 of the internal circuit 1 is saved. In this way, when the DPD controller 110 transitions from the standby mode to the DPD mode, multiple DPD enable signals are generated in stages according to the time elapsed since the standby mode, so that the power consumption in the DPD mode is reduced in stages, and the necessary internal circuits continue to operate.

In addition, although not shown in FIG. 3(A), the semiconductor device 100 may further include a controller, an input/output circuit, etc. In an embodiment, the controller may receive an external input signal such as a command, a control signal, data, an address, etc. via the input/output circuit, and control the operation of the internal circuit 120 based on the received command, control signal, or other input signals. In addition, the data processed by the internal circuit 120 may be output to the outside via the input/output circuit. The controller is constructed using hardware and/or software, and may be, for example, a micro controller, a programmable logic, a state machine, etc.

Next, the detail of the DPD controller 110 will be described. The DPD controller 110 has a function of determining the transition from the standby mode to the DPD mode. When the DPD controller 110 determines that the transition to the DPD mode is required, multiple DPD enable signal DPDEN1, DPD enable signal DPDEN2, and DPD enable signal DPDENx for blocking the power supply to specific internal circuits are generated according to the duration of the standby mode.

FIG. 3(B) is a diagram showing a functional configuration of a DPD determination part included in the DPD controller 110. A DPD determination part 160 includes a measurement part 162, a transition time detection part 164, and a DPD signal generation part 166. The DPD determination part 160 is implemented using hardware and/or software.

The measurement part 162 measures a time since a time point of entering the standby mode. If the DPD controller 110 is activated in the standby mode, the time point of entering the standby mode may be the time when the DPD controller 110 starts to operate. Alternatively, if the DPD controller 110 is notified of the standby mode from another controller, the time point of entering the standby mode may be the time determined by a signal representing the standby mode. The measurement part 162 is not specifically limited to this configuration, and may, for example, include a counter that counts a clock signal.

The transition time detection part 164 monitors the time measured by the measurement part 162, and detects the time to transition to the DPD mode. Specifically, when a measurement time is consistent with a predetermined time Ta, it is determined to transition to a first DPD mode. When the measurement time is consistent with a predetermined time Tb, it is determined to transition to a second DPD mode. When the measurement time is consistent with a predetermined time Tc, it is determined to transition to a third DPD mode.

The DPD signal generation part 166 generates multiple DPD enable signals DPDEN1, DPDEN2, and DPDENx in response to the detection result of the transition time detection part 164. Taking the example described above, when the transition time to the first DPD mode is detected, the DPD enable signal DPDENx transferred to the H level is generated. When the transition time to the second DPD mode is detected, the DPD enable signal DPDEN2 transferred to the H level is generated. When the transition time to the third DPD mode is detected, the DPD enable signal DPDEN1 transferred to the H level is generated. In this way, according to the time elapsed since the standby mode, the DPD enable signal DPDEN1, the DPD enable signal DPDEN2, and the DPD enable signal DPDENx are generated in stages, thereby blocking the power supply to the internal circuit x, the internal circuit 2, and the internal circuit 1 in stages.

In addition, in the description, three DPD enable signals DPDEN1, DPDEN2, and DPDENx supplied to three internal circuits 1, 2, and x are exemplified, but the number of DPD enable signals and the number of internal circuits that block the power supply through the DPD enable signals may be set freely.

Figure 4:
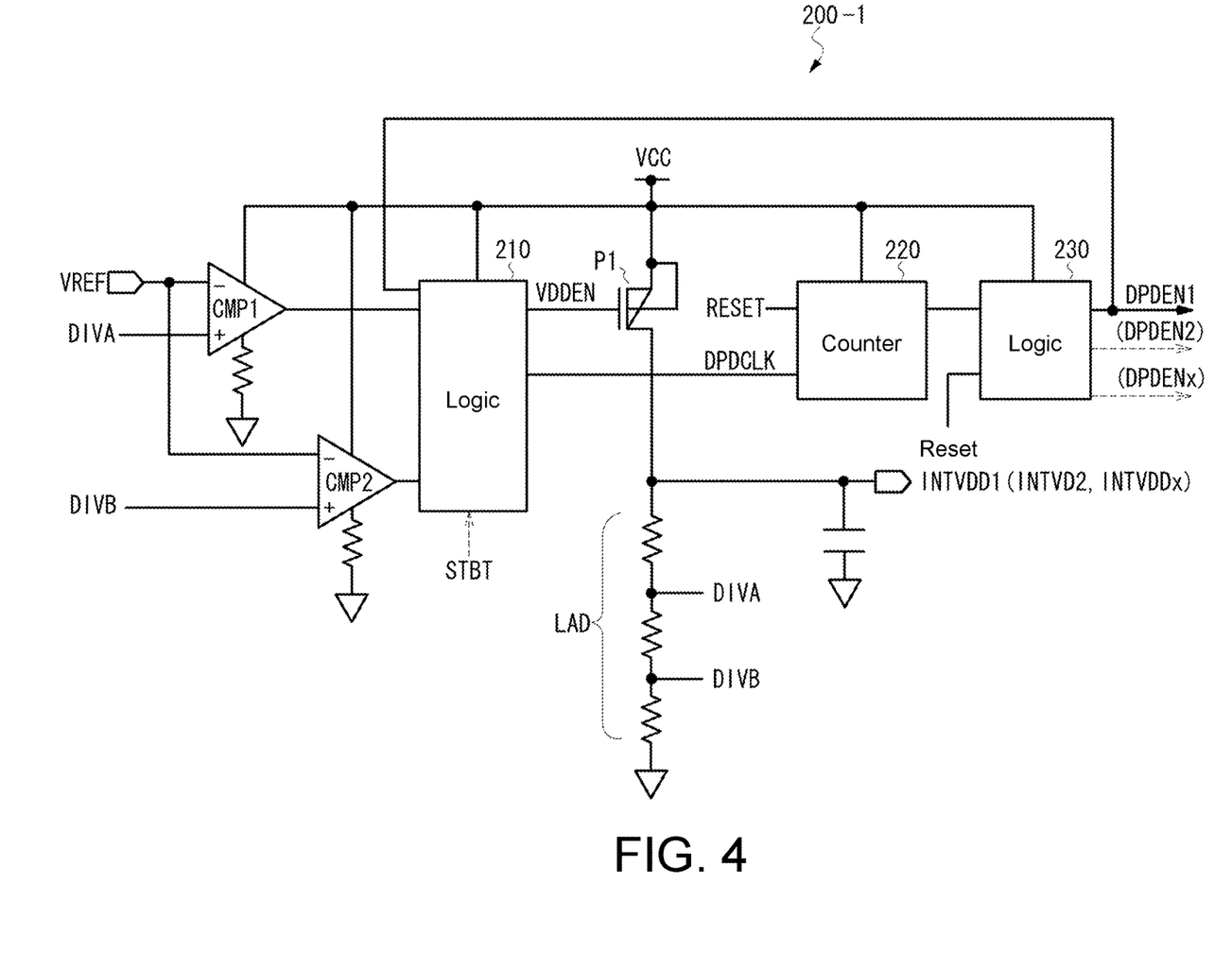
FIG. 4 is a diagram showing a configuration of an internal voltage generation circuit for standby supporting the DPD mode according to an embodiment of the disclosure.

Next, the specific configuration of the semiconductor device of this embodiment will be described. FIG. 4 is a diagram showing a configuration of an internal voltage generation circuit supporting the DPD mode operating in the standby mode. In terms of the corresponding relationship with FIG. 3(A), an internal voltage generation circuit 200-1 shown in this drawing is a circuit that supplies the internal voltage VDD1 to the internal circuit 1, and is a circuit equipped with the DPD determination function of the DPD controller 110. Therefore, it is necessary to have an internal voltage generation circuit 200-2 and an internal voltage generation circuit 200-x with the same functions as the internal circuit 2 and the internal circuit x of FIG. 3(A). However, the internal voltage generation circuit 200-2 and the internal voltage generation circuit 200-x have the same configurations as the internal voltage generation circuit 200-1 shown in FIG. 4, so the descriptions are omitted here.

As shown in FIG. 4, the internal voltage generation circuit 200-1 supporting the DPD mode is a circuit that generates the internal voltage VDD1 (for example, 2.4 V) by the external power supply voltage VCC (for example, 3.3 V). As shown in this drawing, the internal voltage generation circuit 200-1 includes two comparators CMP1 and CMP2, a logic 210, a PMOS transistor P1, a resistance ladder LAD, a counter 220, and a logic 230. The internal voltage generation circuit 200-2 and the internal voltage generation circuit 200-x not shown here are also configured in the same way.

In a current path between the external power supply voltage VCC and the ground (GND), the PMOS transistor P1 and the resistance ladder LAD including multiple series resistors are connected in series. A switch control signal VDDEN output from the logic 210 is applied to the gate of the transistor P1. When the switch control signal VDDEN is at the L level, the transistor P1 is turned on and the power is supplied from the external power supply voltage VCC. The voltage supply node INTVDD1 is connected between the transistor P1 and the resistance ladder LAD. The internal voltage VDD1 is supplied from the voltage supply node INTVDD1. One or more load circuits are connected to the voltage supply node INTVDD1. In the internal voltage generation circuit 200-2 and the internal voltage generation circuit 200-x, the internal voltage VDD2 and the internal voltage VDDx are supplied from the voltage supply node INTVDD2 and the voltage supply node INTVDDx. One or more load circuits are connected to the voltage supply node INTVDD2 and the voltage supply node INTVDDx.

The resistance ladder LAD is connected between the voltage supply node INTVDD1 and the GND. A first voltage DIVA divided by resistance is generated at a first selected tap position and a second voltage DIVB divided by resistance is generated at a second selected tap position of the resistance ladder LAD. The first voltage DIVA is greater than the second voltage DIVB (DIVA>DIVB).

The comparator CMP1 inputs the reference voltage VREF at a non-inverting input terminal (−), inputs the first voltage DIVA at an inverting input terminal (+), and provides the H or L level output representing the comparison result to the logic 210. The comparator CMP2 inputs the reference voltage VREF at the non-inverting input terminal (−), inputs the second voltage DIVB at the inverting input terminal (+), and provides the H or L level output representing the comparison result to the logic 210.

The logic 210 generates the switch control signal VDDEN based on the comparison results of the comparator CMP1 and the comparator CMP2. In an embodiment, at the time point of entering the standby mode, the logic 210 enables the switch control signal VDDEN to be transferred to the H level, and sets the transistor P1 to be not turned on. Through stopping the supply of the external power supply voltage VCC, the voltage of the voltage supply node INTVDD1 is discharged to the GND via the resistance ladder LAD. At this time, the voltage of the voltage supply node INTVDD changes with the resistor-capacitor (RC) time constant of the resistance of the resistance ladder LAD and the load capacitance connected to the voltage supply node INTVDD1. Due to the relationship of the first voltage DIVA>the second voltage DIVB, after the comparison result of the comparator CMP1 is transferred from the H level to the L level, the comparison result of the comparator CMP2 is transferred from the H level to the L level.

When the comparison results of the comparator CMP1 and the comparator CMP2 both become the L level, the logic 210 enables the switch control signal VDDEN to be transferred from the H level to the L level, and sets the transistor P1 to be turned on. As a result, when the power is supplied from the external power supply voltage VCC, the first voltage DIVA and the second voltage DIVB rise, the comparison results of the comparator CMP1 and the comparator CMP2 both become the H level, and in response, the logic 210 enables the switch control signal VDDEN to be transferred from the L level to the H level, and sets the transistor P1 to be not turned on.

The time until the first voltage DIVA and the second voltage DIVB become less than the reference voltage VREF, that is, the time until the comparison results of the comparator CMP1 and the comparator CMP2 both become the L level is determined according to the RC time constant.

The logic 210 then generates a clock signal DPDCLK based on the comparison results of the comparator CMP1 and the comparator CMP2, and provides the clock signal DPDCLK to the counter 220. Specifically, when it is detected that the first voltage DIVA and the second voltage DIVB both become less than the reference voltage VREF, the clock signal DPDCLK with a certain pulse width is generated in response. For example, the clock signal DPDCLK may be a clock signal in synchronization with the switch control signal VDDEN.

The counter 220 counts the clock of the clock signal DPDCLK, and provides a count result to the logic 230. The counter 220 is reset through a reset signal when the DPD mode is dismissed.

The logic 230 receives a count value of the counter 220, detects whether the count value has reached a predetermined number of times N1. When the count value has reached, the DPD enable signal DPDEN1 for blocking the power supply (for example, the H level indicates an enable state, and the L level indicates a disabled state) is generated. It should be noted here that the time of the internal voltage generation circuit 200-2 and the internal voltage generation circuit 200-x generating the DPD enable signal DPDEN2 and the DPD enable signal DPDENx is different from the DPD enable signal DPDEN1. The logic 230 of the internal voltage generation circuit 200-2 detects whether the count value has reached a predetermined number of times N2 (N2<N1), and the logic 230 of the internal voltage generation circuit 200-x detects whether the count value has reached a predetermined number of times N3 (N3<N2). When the number of times N2 and the number of times N3 are detected, the DPD enable signal DPDEN2 and the DPD enable signal DPDENx are generated.

The DPD enable signal DPDEN1 generated by the logic 230 is fed back to the logic 210. When the logic 210 receives the DPD enable signal DPDEN1 at the H level, the logic 210 forcibly sets the transistor P1 to be not turned on to block the power from the external power supply voltage VCC. As a result, the operation of the internal circuit 1 is stopped. The same applies to the internal voltage generation circuit 200-2 and the internal voltage generation circuit 200-x. In addition, the logic 230 may set the DPD enable signal DPDEN1 to be disabled in response to the reset signal.

Figure 5:
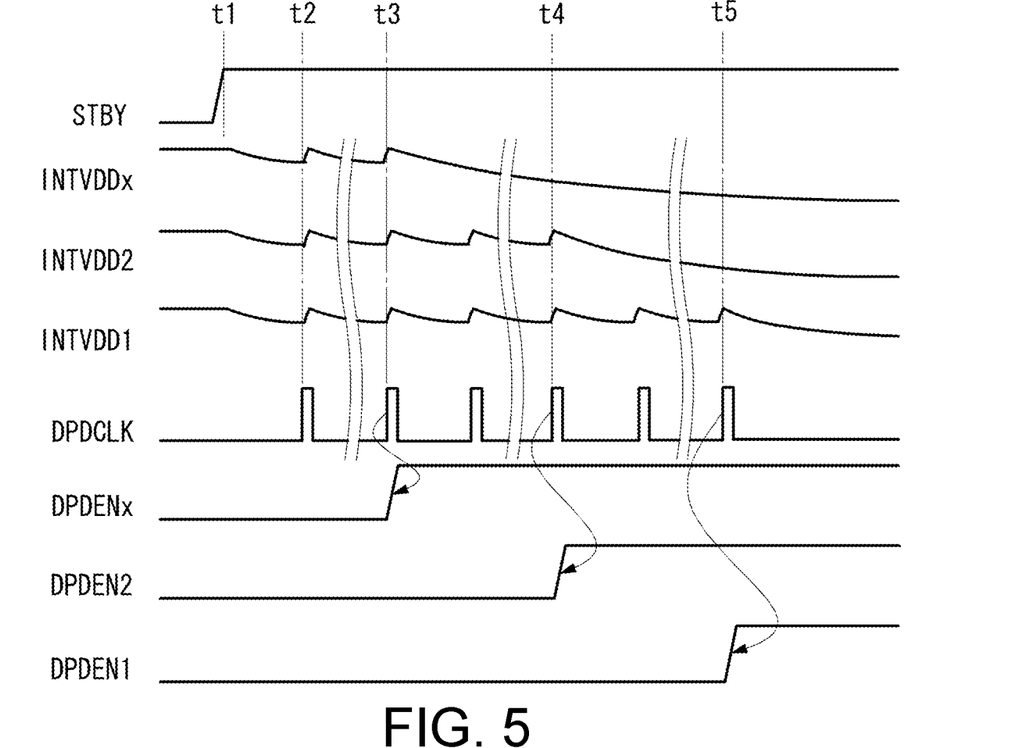
FIG. 5 is a diagram showing operating waveforms of each part of the internal voltage generation circuit shown in FIG. 4.

Next, the operation of the semiconductor device 100 will be described with reference to the operating waveforms of FIG. 5. It is assumed that at a time t1, the semiconductor device 100 transitions from the active mode to the standby mode. In response to the standby mode, the logic 210 enables the switch control signal VDDEN to be transferred to the H level regardless of the comparison results of the comparator CMP1 and the comparator CMP2, and sets the transistor P1 to be not turned on. As a result, the power supply of the external power supply voltage VCC is blocked, and the voltage of the voltage supply node INTVDD1 gradually decreases. The internal voltage generation circuit 200-2 and the internal voltage generation circuit 200-x also operate in the same way, and the voltages of the voltage supply node INTVDD2 and the voltage supply node INTVDDx gradually decrease.

At a time t2, when the first voltage DIVA and the second voltage DIVB become less than the reference voltage VREF, the logic 210 enables the switch control signal VDDEN to be transferred to the L level, and sets the transistor P1 to be turned on. As a result, the power is supplied from the external power supply voltage VCC, and the voltage of the voltage supply node INTVDD1 rises. When the first voltage DIVA and the second voltage DIVB become greater than the reference voltage VREF, the logic 210 enables the switch control signal VDDEN to be transferred to the H level, and sets the transistor P1 to be not turned on. The logic 210 generates the clock signal DPDCLK that enables the switch control signal VDDEN to be inverted. At this time, the clock is counted by the counter 220.

After that, the same operation is repeated. When the logic 230 detects that the count value of the counter 220 for the clock of the clock signal DPDCLK is consistent with the predetermined number of times N1, the DPD enable signal DPDEN1 for blocking the power supply is generated, the voltage of the voltage supply node INTVDD1 drops, and the operation of the internal circuit 1 stops. Here, there is a relationship of N1>N2>Nx, so the DPD enable signal DPDENx is first generated, then the DPD enable signal DPDEN2 is generated, and finally the DPD enable signal DPDEN1 is generated.

In this way, according to this embodiment, it is possible to automatically transition from the standby mode to the DPD mode without inputting an external command for transitioning to the DPD mode. Therefore, even a semiconductor device that does not support the command for transitioning to the DPD mode can use the DPD mode, and the user convenience is improved. Furthermore, multiple DPD enable signals are generated according to the duration of the standby mode, so the operation of the internal circuit may be stopped in stages in the DPD mode. As a result, it is possible to maintain the operation of the circuit with high priority in the standby mode, and to effectively reduce the power consumption in the standby mode or the DPD mode.

Figure 6:
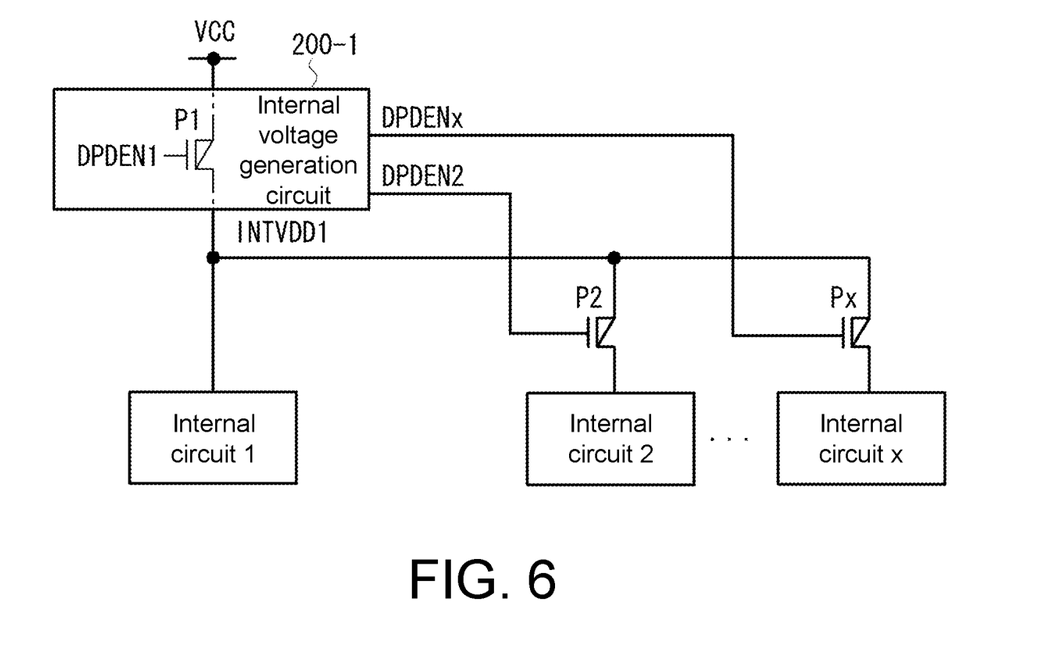
FIG. 6 is a diagram showing another configuration of the internal voltage generation circuit according to an embodiment of the disclosure.

In the embodiment, the internal voltage generation circuit 200-1, the internal voltage generation circuit 200-2, and the internal voltage generation circuit 200-x respectively generating the DPD enable signal DPDEN1, the DPD enable signal DPDEN2, and the DPD enable signal DPDENx are exemplified, but not limited thereto. It is also possible for one internal voltage generation circuit 200-1 to generate the DPD enable signal DPDEN1, the DPD enable signal DPDEN2, and the DPD enable signal DPDENx. At this time, as shown in FIG. 6, the voltage supply node INTVDD1 of the internal voltage generation circuit 200-1 is connected to the internal circuit 2 and the internal circuit x via the transistor P2 and the transistor Px. The internal voltage VDD1 is respectively supplied to the internal circuit 1, the internal circuit 2, and the internal circuit x.

When the count value of the counter 220 reaches the number of times Nx, the logic 230 first supplies the DPD enable signal DPDENx transferred to the H level to the transistor Px to block the supply of the internal voltage VDD1 to the internal circuit x. Next, when the count value reaches the number of times N2, the DPD enable signal DPDEN2 transferred to the H level is supplied to the transistor P2 to block the supply of the internal voltage VDD2 to the internal circuit 2. Next, when the count value reaches the number of times N1, the DPD enable signal DPDEN1 transferred to the H level is generated at the transistor P1 to block the power supply from the external power supply voltage VCC to the voltage supply node INTVDD1.

Figure 7:
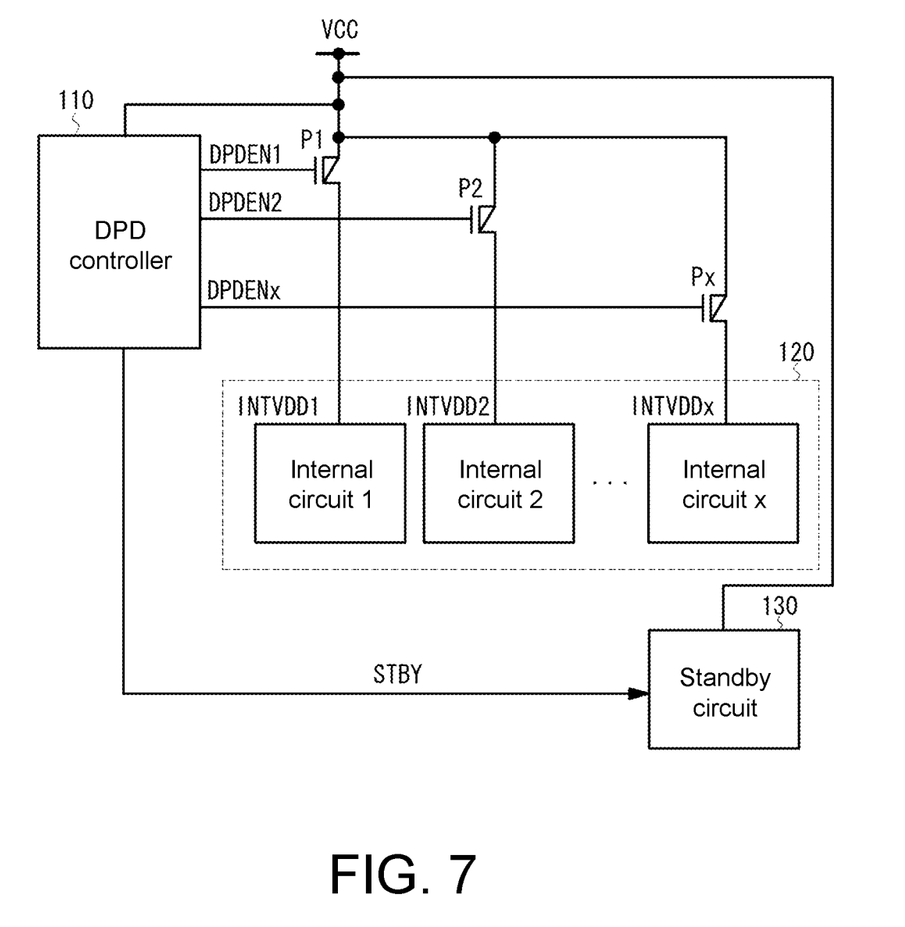
FIG. 7 is a diagram showing a configuration of a semiconductor device according to a second embodiment of the disclosure.

Next, a second embodiment of the disclosure will be described. FIG. 7 is a diagram showing a configuration of a semiconductor device 100A according to the second embodiment of the disclosure, and the same configuration as in FIG. 3(A) is denoted by the same reference number. In the second embodiment, a standby circuit 130 is provided. The standby circuit 130 may operate in the standby mode in response to a standby signal STBY from the DPD controller 110. The standby circuit 130 operates at the power consumption required by the standby mode, but unlike the internal circuit 1, the internal circuit 2, and the internal circuit x, the standby circuit 130 does not transition to the DPD mode. That is, the external power supply voltage VCC of the standby circuit 130 will not be blocked. The standby circuit 130 includes, for example, a volatile register, etc. for holding circuit parameters, user information, etc. required in the active mode, and prevents data from disappearing in the DPD mode, and may quickly recover from the DPD mode to the active mode.

In the embodiment, the internal voltage generation circuit generating the internal power supply voltage VDD by the external power supply voltage VCC is exemplified, but not limited thereto. That is, the internal voltage generation circuit of this embodiment may also generate the second internal voltage VDD2 by the first internal voltage VDD1.

Figure 8:
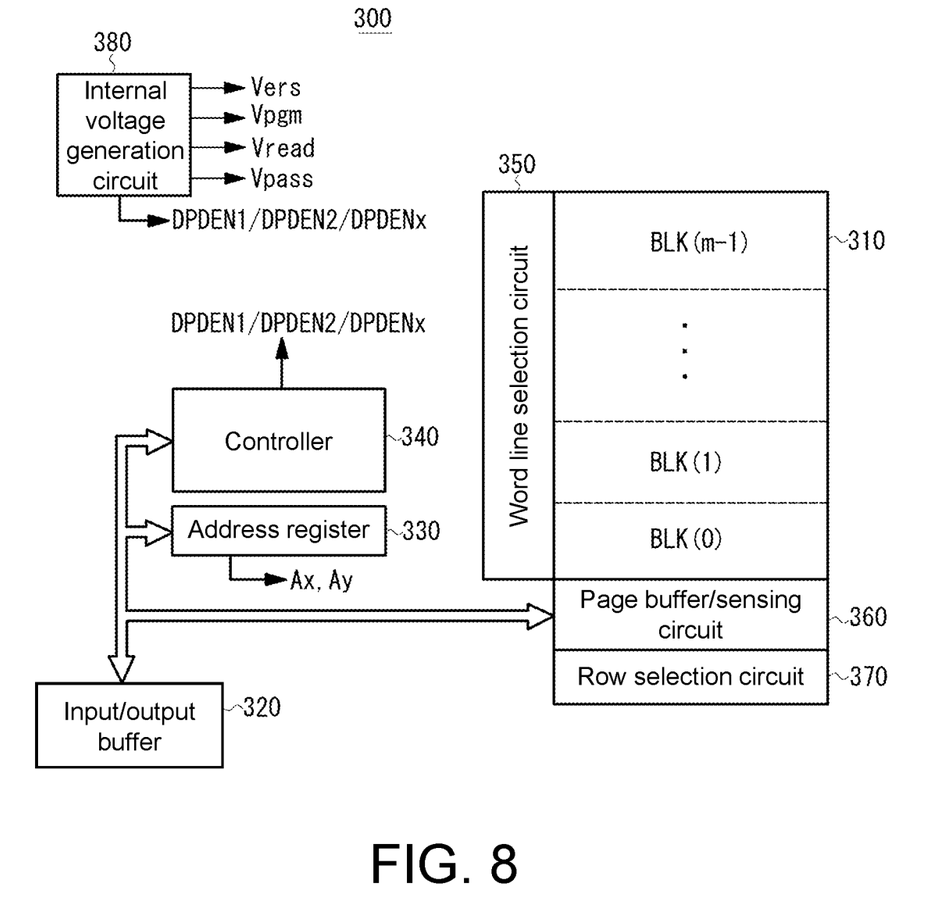
FIG. 8 is a diagram showing a configuration of a NAND type flash memory according to an embodiment of the disclosure.

Next, an example of a NAND type flash memory equipped with the automatic DPD mode of this embodiment is shown in FIG. 8. A flash memory 300 includes the following parts: a storage cell array 310, formed by multiple storage cells arranged in a matrix; an input/output buffer 320, connected to an external input/output terminal I/O; an address register 330, receiving address data from the input/output buffer 320; a controller 340, receiving command data, etc. from the input/output buffer 320 and controlling each part; a word line selection circuit 350, receiving column address information Ax from the address register 330, decoding the column address information Ax, and performing block selection, word line selection, etc. based on a decoding result; a page buffer/sensing circuit 360, holding data read from a page selected by the word line selection circuit 350, or holding input data that should be programmed to the selected page; a row selection circuit 370, receiving row address information Ay from the address register 330, decoding the row address information Ay, and selecting row address data in the page buffer/sensing circuit 360 based on the decoding result; and an internal voltage generation circuit 380, generating various voltages (a write voltage Vpgm, a pass voltage Vpass, a read pass voltage Vread, an erase voltage Vers, etc.) required for data reading, programming, erasing, etc.

In an embodiment, the flash memory 300 may output a busy signal/ready signal for informing an internal operating state (program, erase, read, etc.) from an external terminal. The controller 340 transitions to the standby mode in response to the output of the busy signal/ready signal. As described in the embodiment, the time since the time point of entering the standby mode is measured. When the measurement time reaches a certain time, the DPD enable signal DPDEN is generated and supplied to an internal peripheral circuit. The peripheral circuit receiving the DPD enable signal DPDEN blocks the power supply.

In addition, in another embodiment, the internal voltage generation circuit 380 includes the internal voltage generation circuit 200-1 shown in FIG. 4 or FIG. 6. In response to the busy signal/ready signal, the time since the time point of entering the standby mode is measured. When the measurement time reaches a certain time, the DPD enable signal DPDEN is generated and supplied to the internal peripheral circuit.

The embodiments of the disclosure have been described in detail, but the disclosure is not limited to specific embodiments. Various modifications and changes may be made within the scope of the spirit of the disclosure described in the claims.

What is claimed is:

1. A semiconductor device, comprising:
a semiconductor integrated circuit, operating in response to an external input signal;
a measurement part, measuring a time since a time point of the semiconductor device entering a standby mode; and
a generation part, generating a plurality of power down enable signals for further reducing power consumption in the standby mode in response to elapse of a measurement time measured by the measurement part.

2. The semiconductor device according to claim 1, wherein
the generation part generates at least a first power down enable signal and a second power down enable signal, and
the first power down enable signal is generated when the measurement time reaches a first determination time, and the second power down enable signal is generated when the measurement time reaches a second determination time longer than the first determination time.

3. The semiconductor device according to claim 2, wherein the first power down enable signal is provided to a first internal circuit of the semiconductor integrated circuit, and the second power down enable signal is provided to a second internal circuit of the semiconductor integrated circuit, and a power supply to the first internal circuit and the second internal circuit is blocked in response to the first power down enable signal and the second power down enable signal.

4. The semiconductor device according to claim 1, wherein
the semiconductor integrated circuit comprises a voltage generation circuit generating a second supply voltage based on a first supply voltage, and
the voltage generation circuit comprises the measurement part and the generation part, and the voltage generation circuit generates the plurality of power down enable signals.

5. The semiconductor device according to claim 4, wherein
the voltage generation circuit comprises a plurality of voltage generation circuits, and the plurality of voltage generation circuits generate the plurality of power down enable signals.

6. The semiconductor device according to claim 1, wherein
the semiconductor integrated circuit comprises: an internal circuit, blocking a power supply in response to the plurality of power down enable signals; and an internal circuit for standby, operating in the standby mode and not blocking the power supply according to the power down enable signal.

7. The semiconductor device according to claim 6, wherein
the internal circuit for standby comprises a volatile storage circuit.

8. The semiconductor device according to claim 4, wherein
the voltage generation circuit comprises:
a first node, supplying the first supply voltage;
a second node, supplying the second supply voltage to a load;
a connection circuit, connected between the first node and the second node, and connecting or disconnecting the first node and the second node in response to a control signal;
a resistance ladder, connected between the second node and a reference potential;

a clock generation circuit, generating a clock signal based on a resistor-capacitor time constant generated between the second node and the reference potential when the first node and the second node are disconnected;
a logic circuit, generating the control signal based on the clock signal;
a counter, counting a clock generated based on the clock signal; and
a generation circuit, generating the power down enable signal based on a count value of the counter.

9. The semiconductor device according to claim 8, wherein
the generation circuit generates the plurality of power down enable signals based on the count value of the counter.

10. The semiconductor device according to claim 8, wherein
the clock generation circuit comprises a first comparator and a second comparator, and generates the clock signal based on comparison results of the first comparator and the second comparator, the first comparator compares a first voltage generated by the resistance ladder with a reference voltage, and the second comparator compares a second voltage less than the first voltage generated by the resistance ladder with the reference voltage.

11. The semiconductor device according to claim 8, wherein
the connection circuit comprises a p-channel metal oxide semiconductor transistor whose gate is applied with the control signal, and
the logic circuit enables the control signal to be transferred to a low level when a time specified by the resistor-capacitor time constant has elapsed.

12. The semiconductor device according to claim 8, wherein
the logic circuit feeds back the power down enable signal generated by the generation circuit, and sets the connection circuit to be disconnected in response to the power down enable signal.

13. The semiconductor device according to claim 1, wherein
the semiconductor integrated circuit comprises a circuit related to a flash memory, and the standby mode transitions in response to a busy signal or a ready signal of the flash memory.

* * * * *